United States Patent

Mitsui et al.

[11] Patent Number: 5,955,223
[45] Date of Patent: Sep. 21, 1999

[54] PHASE-SHIFT MASK BLANK AND PROCESS FOR THE PRODUCTION THEREOF COMPRISING A SEMI TRANSPARENT FILM WITH SILICON AND NITROGEN

[75] Inventors: Hideaki Mitsui; Kenji Matsumoto; Yoichi Yamaguchi, all of Tokyo, Japan

[73] Assignee: Hoya Corporation, Japan

[21] Appl. No.: 08/816,942

[22] Filed: Mar. 14, 1997

Related U.S. Application Data

[63] Continuation of application No. PCT/JP95/01432, Jul. 19, 1995.

[51] Int. Cl.[6] .................................................. G03F 9/00
[52] U.S. Cl. ............................................. 430/5; 428/432
[58] Field of Search .......................... 430/5, 322, 324; 428/432; 427/595

[56] References Cited

U.S. PATENT DOCUMENTS

| | | |
|---|---|---|
| 5,415,953 | 5/1995 | Alpay et al. . |
| 5,474,864 | 12/1995 | Isao et al. ................. 430/5 |
| 5,482,799 | 1/1996 | Isao et al. . |
| 5,538,816 | 7/1996 | Hashimoto et al. ................. 430/5 |
| 5,605,776 | 2/1997 | Isao et al. ................. 430/5 |
| 5,629,114 | 5/1997 | Isao et al. ................. 430/5 |

FOREIGN PATENT DOCUMENTS

| | | |
|---|---|---|
| 43 39 481 A1 | 5/1994 | Germany . |
| 44 35 773 A1 | 4/1995 | Germany . |
| 4-204653 | 7/1992 | Japan . |
| 5-127361 | 5/1993 | Japan . |
| 6-61183 | 3/1994 | Japan . |
| 6-308713 | 11/1994 | Japan . |
| 06332152 | 12/1994 | Japan . |
| 6-332152 | 12/1994 | Japan . |

OTHER PUBLICATIONS

Shih and Dove J. Vac. Sci. Technol. B 12(1), Jan./Feb. 1984, pp. 32–36 Thin Film materials for the preparation of attenuating phase shift masks.

Patent Abstracts of Japan vol. 095, No. 003, Apr. 1995.

*Primary Examiner*—S. Rosasco
*Attorney, Agent, or Firm*—Nixon & Vanderhye

[57] ABSTRACT

PURPOSE: To provide the phase shift mask which can be produced while the generation of microdefects is suppressed with relatively simple stages and with which pattern transfer with a high resolution is possible and the phase shift mask blank which is the blank material thereof.

CONSTITUTION: The mask patterns to be formed on a transparent substrate 1 of this phase shift mask are composed of light transparent parts 4 which allow the transmission of light of the intensity substantially contributing to exposing and light translucent parts 2 which allow the transmission of the light of the intensity substantially contributing to exposing. The phase shift mask is so formed that the phase of the light past the light translucent parts 2 and the phase of the light past the light transparent parts 4 are varied by shifting the phase of the light passing the light translucent parts 2, by which the light rays passing near the boundary parts of the light transparent parts 4 and the light translucent parts 2 are negated with each other and the contrast in the boundary parts is well maintained. The light translucent parts 2 are composed of thin films consisting of materials consisting of oxygen, molybdenum and silicide as main constituting elements.

11 Claims, 3 Drawing Sheets

1: TRANSPARENT SUBSTRATE
2: LIGHT SEMI-TRANSMITTING PORTION
3: LIGHT TRANSMITTING PORTION

1: TRANSPARENT SUBSTRATE
2a: LIGHT SEMI-TRANSMITTING FILM

2: LIGHT SEMI-TRANSMITTING PORTION
3: LIGHT TRANSMITTING PORTION

1: TRANSPARENT SUBSTRATE
2a: LIGHT TRANSMITTING FILM

4a: RESIST FILM

4: RESIST PATTERN

2: LIGHT SEMI-TRANSMITTING PORTION
3: LIGHT TRANSMITTING PORTION

1: TRANSPARENT SUBSTRATE
2: LIGHT SEMI-TRANSMITTING PORTION
3: LIGHT TRANSMITTING PORTION

PHASE-SHIFT MASK BLANK AND PROCESS FOR THE PRODUCTION THEREOF COMPRISING A SEMI TRANSPARENT FILM WITH SILICON AND NITROGEN

This is a Continuation of PCT application PCT/JP95/01432, filed Jul. 19, 1995.

TECHNICAL FILED

The present invention relates to a phase-shift mask, a process for the production thereof, and a phase-shift mask obtained from the above mask blank.

TECHNICAL BACKGROUND

In the production of semiconductor LSI, a phase-shift mask is used as one of photo masks for the transfer of fine patterns. A half-toned phase-shift mask which comes under the above phase-shift mask is known as being suitable for the transfer of a single hole or dot or an isolated pattern such as a line or space.

In the above half-toned phase-shift mask, a mask pattern formed on the surface of a transparent substrate is composed of a light-transmitting portion for transmitting light having an intensity which contributes to substantial exposure and a light-semi-transmitting portion for transmitting light having an intensity which does not contribute to the substantial exposure, and the phase of light which passes through the light-transmitting portion and the phase of light which has passes through the light-semi-transmitting portion are differentiated, whereby light beams which have been transmitted offset each other in the vicinity of a boundary between the light-transmitting portion and the light-semi-transmitting portion so as to keep up a good contrast in the boundary. For example, JP-A-5-127361 discloses a half-toned phase-shift mask which gives a phase difference of 180°.

In the half-toned phase-shift mask disclosed in the above Laid-open Publication, the light-semi-transmitting film constituting the light semi-transmitting portion is composed of a monolayer film formed of a material having a homogeneous composition, such as a film of $CrO_x$, $CrN_x$, $CrO_xN_y$, $CrO_xN_yC_z$, or the like.

When compared with a half-toned phase-shift mask of which the light semi-transmitting portion has a multi-layered laminate structure formed of a layer having a high transmittance (e.g., spin on glass called SOG for short) and a layer having a low transmittance (e.g., chromium), the above half-toned phase-shift mask having a light semi-transmitting portion formed of a monolayer film has advantages in that the production steps thereof are decreased in number and simplified, that the vertical construction in a pattern form is attained and that the imperfection generation rate can be decreased.

Concerning the light semi-transmitting film of $CrO_x$, $CrN_x$, $CrO_xN_y$, $CrO_xN_yC_z$, or the like, the above Laid-open Publication discloses a method in which chromium is used as a sputtering target and an oxide, a nitride, an oxide/nitride or an oxide/nitride/carbide of chromium is deposited on a transparent substrate in the presence of a gas of oxygen, nitrogen, etc., in a deposition atmosphere; i.e., a so-called reactive sputtering method.

The light semi-transmitting film of $CrO_x$, $CrN_x$, $CrO_xN_y$, $CrO_xN_yC_z$, which is formed by the above sputtering method, is poor in electrical conductivity when it is so formed as to simultaneously satisfies the property of transmitting light to an extent that the light does not contribute to exposure, i.e., the requirement that the transmittance to exposure light should be 4 to 20% and the requirement that the light semi-transmitting portion should give a predetermined phase difference. The light semi-transmitting film therefore has a problem that, in writing on a resist with an electron beam for patterning the resist provided thereon, shot electrons are charged (charge-up) in the resist so that no accurate pattern can be formed.

Further, the poor electrical conductivity causes an electrostatic charge, and there is a problem that a pattern is broken when the mask is produced or used, or that foreign matter or dust is likely to be adsorbed. The defect is therefore that, for preventing the charging phenomenon, therefore, it is required to form an electrically conductive layer which conducts and diffuses electricity, for example, on the transparent substrate, which increases the production steps in number.

Furthermore, there is another problem below. The electrically conductive layer formed between the transparent substrate and the light semi-transmitting film is required be transparent to exposure light. In particular, for coping with exposure light having a shorter wavelength, which is used as patterns having a high resolution are demanded in recent years, it is required to develop a new electrically conductive material transparent to the above exposure light.

The present inventors have already proposed a light semi-transmitting film containing a transition metal such as tungsten, tantalum or chromium and silicon as a substitute for the above chromium-containing light semi-transmitting film which is poor in electrical conductivity. The present inventors have been therefore able to provide a phase-shift mask blank which has both a light semi-transmitting characteristic and electrical conductivity by the formation of a light semi-transmitting film containing a transition metal and silicon on a transparent substrate and which overcomes the above problem of charging of a resist in patterning by writing with an electron beam, the breakage of a pattern at the mask production step or at the time of use and the problem of foreign matter or dust adsorption.

Meanwhile, when the above light semi-transmitting film containing a transition metal and silicon is formed on a transparent substrate by a sputtering method, generally, an oxygen gas is sometimes introduced together with an inert gas such as an argon gas. The purpose in introducing an oxygen gas together with an inert gas is to adjust the properties of the light semi-transmitting film such as transmittance, refractive index and electrical conductivity (resistance) to desired values by adjusting the oxygen gas amount ratio to control the amount of oxygen to be taken into the film. However, the introduction of an oxygen gas in sputtering newly causes the following problem. That is, a phenomenon takes place, in which the oxygen gas introduced at a spattering time oxidizes a spattering target surface, where an oxide grows, and the oxides bursts open due to an electric field charged for the sputtering and splashes on the substrate surface in a large cluster. This phenomenon is what is called "cluster adhering by abnormal discharging". The cluster not only causes dust and particles, but also forms convex portions. On the other hand, when the film formation proceeds in a state in which the cluster adhering to the substrate is included, and when the cluster then peels off at this stage, convex portions are formed. And, the concavo-convex form formed on the surface of the light semi-transmitting film invites the following defects.

① A spatial invariability in phase shift amount is caused.

② The transmittance of the light semi-transmitting film is decreased due to the irregular reflection of exposure light.

③ When the blank surface contacts other substance, at a handling time in particular, there is generated dust which causes a decrease in exposure performance.

④ The formation of a finer pattern is hampered.

It is therefore an object of the present invention to provide a phase-shift mask blank which overcomes the above problems ① to ④ and a process for the production thereof.

It is another object of the present invention to provide a phase-shift mask obtained by patterning the light semi-transmitting film of the above phase-shift mask blank.

DISCLOSURE OF THE INVENTION

For achieving the above object, the present inventors have obtained light semi-transmitting films containing a transition metal, silicon and nitrogen by allowing predetermined amounts of a nitrogen gas and/or a nitrogen compound gas to be contained in a gas used when a light semi-transmitting film containing a transition metal and silicon is formed on a transparent substrate. And, when the above light semi-transmitting films have been measured for properties, it has been found that there can be obtained a phase-shift mask blank which retains the above advantages of the light semi-transmitting film of a transition metal and silicon, whose concavo-convex surface form is remarkably decreased and which overcomes the above defects ① to ④. It has been also found that the above phase-shift mask blank is excellent in the fine processability of a light semi-transmitting film and can give a desired phase-shift mask.

The present invention has been completed on the above findings, and the gist of the present invention consists in (I) a phase-shift mask blank having a light semi-transmitting film which at least contains a transition metal selected from tungsten, tantalum, chromium or titanium, silicon and nitrogen on a transparent substrate, the light semi-transmitting film containing 5 to 70 at % of nitrogen, and (II) a process for the production of a phase-shift mask blank, which comprises the step of forming a light semi-transmitting film which at least contains a transition metal selected from tungsten, tantalum, chromium or titanium, silicon and nitrogen on a transparent substrate while introducing a gas containing at least a nitrogen gas and/or a nitrogen compound gas, wherein the gas introduced when the light semi-transmitting film is formed contains the nitrogen gas and/or the nitrogen compound gas in an amount of 5 to 90 vol % based on the total flow amount of the gas.

Further, the gist of the present invention consists in (III) a phase-shift mask having a mask pattern formed of a light-transmitting portion and a light semi-transmitting portion, obtained by a patterning treatment in which the light semi-transmitting film of the phase-shift mask blank described in the above (I) is selectively removed in conformity with a predetermined pattern.

PREFERRED EMBODIMENTS FOR WORKING THE INVENTION

Figure 1A:
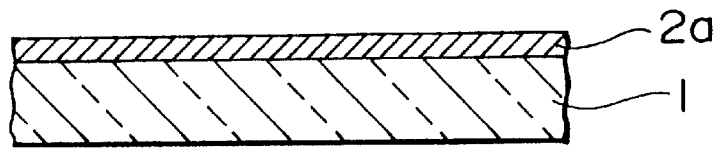
FIG. 1 shows cross-sectional views of a phase-shift mask blank and a phase-shift mask of the present invention.

First, the phase-shift mask blank of the present invention will be explained.

The phase-shift mask blank of the present invention has a characteristic feature in that it has a light semi-transmitting film which at least contains a transition metal selected from tungsten, tantalum, chromium or titanium, silicon and nitrogen on a transparent substrate, and that the light semi-transmitting film contains 5 to 70 at % of nitrogen.

The transparent substrate is not specially limited so long as it can be used as a transparent substrate for a phase-shift mask blank, and it can be selected from substrates which can give a sufficient transmitted light intensity at the wavelength of exposure light used. Generally, a quartz glass substrate is used.

The light semi-transmitting film formed on the above transparent substrate is essentially required to at least contain a transition metal selected from tungsten, tantalum, chromium or titanium, silicon and nitrogen. The reason for allowing the light semi-transmitting film to contain the above transition metal and silicon as essential components is that the film is imparted with a light semi-transmitting characteristic and electrical conductivity by them, and that the problem of "charge-up" at a time of patterning a resist on the light semi-transmitting film and washing the mask and the problem of adsorption of dust, etc., because of an electrical charge are decreased.

Further, the reason for allowing the light semi-transmitting film to contain nitrogen as an essential component is as follows.

(i) As compared with a conventional light semi-transmitting film formed of a transition metal, silicon and oxygen, the light semi-transmitting film containing nitrogen has a surface of which the concavo-convex form is decreased, so that the above defects ① to ④, i.e., a spatial variability of a phase shift amount, a decrease in the transmittance of the light semi-transmitting film, the occurrence of dust and the hampering of formation of a finer pattern can be overcome.

(ii) As compared with a conventional light semi-transmitting film formed of a transition metal and silicon, the light semi-transmitting film containing nitrogen is not only improved in transmittance but also excellent in the adhesion to the substrat and chemical stability in atmosphere.

In the light semi-transmitting film, the content of nitrogen (N) among the transition metal, silicon and nitrogen is particularly essential, and it is limited to 5 to 70 at % based on the total of elements in the film. The reason therefor is as follows. When the content of nitrogen is less than 5 at %, some one of the transmittance, sheet resistance and center-line average roughness exceeds the transmittance (4~20%), the sheet resistance (50~5×10⁷ Ω/□) and the center-line average roughness (0.1~50 nmRa) which are required of the light semi-transmitting film of the phase-shift mask blank. When it exceeds 70 at %, the transmittance exceeds the transmittance required of the light semi-transmitting film of the phase-shift mask. On the other hand, when the content of nitrogen in the film is 5 to 70 at %, there is obtained a light semi-transmitting film which satisfies all of the transmittance, the sheet resistance and the center-line average roughness required of the light semi-transmitting film of the phase-shift mask blank.

In the phase-shift mask blank of the present invention, those properties such as the transmittance, sheet resistance and center-line average roughness can be changed in a good balance by changing the content of nitrogen in the light semi-transmitting film as a composition in the range of 5 to 70 at % as required. The content of nitrogen is preferably 10 to 65 at %, particularly preferably 15 to 60 at %.

In addition to the above nitrogen, the content of the transition metal constituting the light semi-transmitting film based on the total of elements in the film is preferably 5 to 55 at %, more preferably 7 to 50 at %, particularly preferably 10 to 45 at %.

Further, the content of silicon constituting the light semi-transmitting film based on the total of elements in the film is preferably 5 to 80 at %, more preferably 7 to 75 at %, particularly preferably 10 to 70 at %.

Of silicon atoms contained in the light semi-transmitting film, those which are forming silicide by directly bonding to the transition metal is not more than ½ of the total of the silicon atoms, and some of the rest are forming nitride by bonding to nitrogen, some are forming oxide by bonding to oxygen, and some are forming other bonds. On the other hand, the distribution of each element in the light semi-transmitting film differs depending upon a film-forming method. In a sputtering method, if a film is formed by sputtering according to an in-line method, a film is formed while the substrate is moved in a chamber. As a result, the distribution of each element is affected by the spatial distribution of a plasma density, so that the amounts of the transition metal contained in a layer close to the substrate and the transition metal contained in a layer close to the surface are relatively greater.

In the phase-shift mask blank of the present invention, the light semi-transmitting film may contain oxygen. The reason for allowing the light semi-transmitting film to contain oxygen is to improve the transmittance of the light semi-transmitting film, to improve the adhesion to the substrate and to improve the chemical stability in atmosphere.

The content of oxygen (O) in the light semi-transmitting film based on the total of elements in the film is preferably less than 70 at %, more preferably less than 60 at %, particularly preferably 50 at %.

In the phase-shift mask blank of the present invention, the transmittance of the light semi-transmitting film to exposure light is preferably 4 to 20%, particularly preferably 5 to 15%. The reason therefor is as follows. When the transmittance is less than 4%, the offsetting effect obtained by the phase difference between light beams passing the light semi-transmitting portion and light transmitting portion in the boundary of both portions is not sufficient. When it exceeds 20%, the resist may be exposed to light which has passed through the light semi-transmitting portion. The transmittance of the light semi-transmitting film to light in visible light region is 30 to 70%.

In the phase-shift mask blank of the present invention, the sheet resistance of the light semi-transmitting film is preferably 50~5×10$^7$ Ω/□. When the film has a composition which gives a sheet resistance of less than 50 Ω/□, the transmittance of the light semi-transmitting film is substantially small, and the desirable transmittance at a desired wavelength is not longer obtained. The phase-shift mask therefore does not perform the function of a half-toned phase-shift mask. Further, when the sheet resistance exceeds 5×10$^7$ Ω/□, the blank is liable to be damaged by charge-up at a time of patterning a resin on the light semi-transmitting film by writing with an electron beam. In view of the thickness controlling property and surface roughness of the light semi-transmitting film, the sheet resistance is particularly preferably 5×10$^2$ to 1×10$^6$ Ω/□.

In the phase-shift mask blank of the present invention, the center-line average roughness (defined in JIS B 0601 and expressed in terms of nmRa) of the light semi-transmitting film to exposure light in each of surfaces from which exposure light is incoming and outgoing is preferably 0.1 to 50 nmRa. The reason therefor is as follows.

Generally, a value which is about 10 times the center-line average roughness tends to be nearly equivalent to a height difference (peak to valley) between a peak portion and a valley portion in a concavo-convex form of the film surface.

Meanwhile, when the height difference in the concavo-convex form on the light semi-transmitting film is almost equivalent to the wavelength of exposure light, and when the phase-shift mask blank having such a light semi-transmitting film is patterned by lithography, the dimensional accuracy in processing is notably decreased due to a spatial variability in the phase shift amount.

The height difference in the concavo-convex form on the surface of the light semi-transmitting film is therefore required to be smaller than the wavelength of exposure light. Generally, the wavelength of exposure light in lithography is currently 468 nm (g ray) or 365 nm (i ray), while 248 nm (KrF excimer laser) and 193 nm (ArF excimer laser) are also used when fine processing accuracy is required.

On the basis of the above tendency, when the center-line average roughness is 50 nm or less, the height difference in the concavo-convex form is about 500 nm or less, and the exposure can be carried out with g ray having a wavelength of 468 nm. This is why the center-line average roughness is preferably 50 nmRa or less. Further, when the exposure with i ray (365 nm) or KrF laser (248 nm) is considered, the center-line average roughness is more preferably 20 nmRa or less, and when the exposure with ArF laser (193 nm) is considered, the center-line average roughness is particularly preferably 10 nmRa or less.

Further, the reason for defining the lower limit of the center-line average roughness to be 0.1 nmRa is as below. Since the concavo-convex form on the surface is determined by the concavo-convex form of the substrate and the size (particle diameter) of sputtering particles even if attempts are made to obtain a flat surface, not only the lower limit of less than 0.1 nmRa is impractical, but also no remarkable effect can be obtained.

The process for the production of a phase-shift mask blank, provided by the present invention, will be explained hereinafter.

The process of the present invention comprises, as an essential step, the step of forming a light semi-transmitting film which at least contains a transition metal selected from tungsten, tantalum, chromium or titanium, silicon and nitrogen on a transparent substrate, and this step is particularly preferably carried out by a sputtering method. In the formation of the light semi-transmitting film by a sputtering method, a target formed of the above transition metal and silicon is used as a sputtering target. Further, it is necessary to introduce nitrogen into the light semi-transmitting film being formed, a gas containing at least a nitrogen gas and/or a nitrogen compound gas is used as a gas introduced into a sputtering apparatus. The above nitrogen compound gas is selected from ammonia, $N_2O$, NO, $NF_3$ or the like.

In the process of the present invention, the amount of the nitrogen gas and/or nitrogen compound gas (these will be sometimes generically referred to as "nitrogen-based gas" hereinafter) based on the total flow amount of the gas introduced into a sputtering apparatus is also essential, and it is limited to 5 to 90 vol %. The reason therefor is as follows. When the amount of the nitrogen-based gas is less than 5 vol %, the formed light semi-transmitting film has an increased refractive index, and it is required to decrease the film thickness for obtaining a predetermined phase shift amount. However, when the light semi-transmitting film has a small thickness, a change in the phase shift amount relative to a change in the film thickness is large, and it is therefore necessary to accurately control the film thickness. On the other hand, as the amount of the nitrogen-based gas increases, the refractive index tends to decrease, and the transmittance and the resistance tend to increase. In particular, when it exceeds 90 vol % based on the total flow amount, the transmittance is large to excess, and the formed light semi-transmitting film is no longer suitable for a half-toned phase-shift mask blank.

In view of the controllability of the film thickness and the controllability of the transmittance, the amount of the nitrogen-based gas is preferably 15 to 85 vol %, particularly preferably 20 to 75 vol %.

In the present invention, when it is desired to allow the light semi-transmitting film being formed to contain oxygen, the gas introduced into a sputtering apparatus may cotnain an oxygen gas and/or an oxygen compound gas. The oxygen compound gas includes $O_3$, $N_2O$, NO and $H_2O$.

When oxygen gas is contained, the amount of the oxygen gas and/or the oxygen compound gas (these will be sometimes referred to as "oxygen-based gas" hereinafter) based on the total flow amount of the gas is preferably 55 vol % or less.

The substrate generally has a temperature of room temperature to 100° C. in a sputtering atmosphere without being heated, since it is exposed to plasma. However, it is preferred to heat the substrate to 100~350° C. The reason therefor is that the heating of the substrate improves the bonding strength of the film and compacts the film to improve the density whereby the film is strengthened.

The essential conditions in the process for the production of a phase-shift mask blank, provided by the present invention, are explained above, while other conditions of producing the light semi-transmitting film on a transparent substrate may be selected from conditions of a general sputtering method.

In another embodiment of the present invention, an inert gas such as an argon gas is used alone as a gas introduced into a sputtering apparatus, and no nitrogen-based gas is used. In this case, there can be obtained a phase-shift mask blank having a light semi-transmitting film which contains a transition metal selected from tungsten, tantalum, chromium or titanium and silicon and which a center-line average roughness of 0.1 to 50 nmRa in each of surfaces from which exposure light is incoming and outgoing. In the so-obtained phase-shift mask blank, the light semi-transmitting film has a surface roughness value desirable as a light semi-transmitting film of a phase-shift mask blank, so that the above defects ① to ④, i.e., the problems of spatial variability in the phase shift amount, a decrease in the transmittance of the light semi-transmitting film, the occurrence of dust and the hamper of the formation of a finer pattern are overcome. Further, the above phase-shift mask blank also has a characteristic feature in a very low resistance. As compared with the above light semi-transmitting film containing nitrogen, however, the above phase-shift mask blank has a defect in that it is difficult to control the refractive index and the transmittance to the wavelength of exposure light.

The phase-shift mask of the present invention will be explained hereinafter. The phase-shift mask of the present invention has a characteristic feature in that a mask pattern formed of a light-transmitting portion and a light semi-transmitting portion is formed by a patterning treatment in which the light semi-transmitting film of the phase-shift mask blank of the present invention is selectively removed in conformity with a predetermined pattern. That is, the point of the phase-shift mask of the present invention is that it is obtained from the phase-shift mask blank of the present invention, and a conventionally known method can be directly employed as a method of forming the mask pattern.

The present invention will be explained further in detail with reference to Examples hereinafter, while the present invention shall not be limited to these Examples.

EXAMPLE 1

Figure 1B:
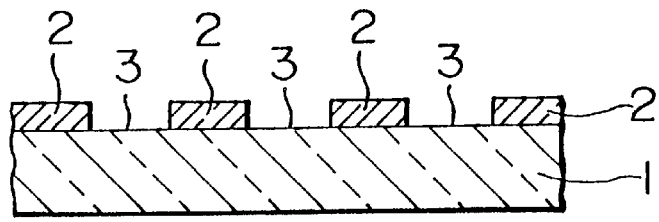

FIGS. 1(a) and 1(b) show cross-sectional views of a half-toned phase-shift mask blank and a half-toned phase-shift mask in Example 1.

As shown in FIG. 1(a), the half-toned phase-shift mask blank has a light semi-transmitting film 2a on a transparent substrate 1. Further, as shown in FIG. 1(b), the half-toned phase-shift mask has a mask pattern formed of a light semi-transmitting portion 2, which is obtained by the patterning treatment of selectively removing the light semi-transmitting film 2a of the half-toned phase-shift mask shown in FIG. 1(a) in conformity with a predetermined pattern, and a light-transmitting portion 3.

(Preparation of phase-shift mask blank)

A half-toned phase-shift mask blank as shown in FIG. 1(a) was prepared as follows. A quartz glass substrate (5 inches long×5 inches wide×0.9 inch thick) of which the main surface was specularly polished was used as a transparent substrate 1. A light semi-transmitting film 2 of tungsten (W), silicon (Si) and nitrogen (N) was formed on the above transparent substrate 1 by an RF magnetron sputtering method.

In the RF magnetron sputtering method, a target formed of W and Si, W/Si=1/1 (at/at), was used. The target and the transparent substrate 1 were placed in predetermined places in an RF magnetron sputtering apparatus, and the transparent substrate 1 was heated to about 200° C. While a gas mixture containing argon (Ar) gas and nitrogen ($N_2$) gas and having an Ar/$N_2$ gas mixing ratio of 77/23 (vol %/vol %) was introduced, a light semi-transmitting film 2a was formed on the transparent substrate 1 by RF magnetron sputtering under the condition of 1.3 KW RF output, to give a phase-shift mask blank shown in FIG. 1(a) (to be referred to as "phase-shift mask blank of Example 1a" hereinafter).

The light semi-transmitting film of the above obtained phase-shift mask blank of Example 1a was studied for an element compositional ratio by X-ray electron spectrometry to show that W/Si/N=40 at %/42 at %/18 at % as shown in Table 1 or that the content of N was 18 at %. The substrate was heated to about 200° C. at a sputtering time, so that the light semi-transmitting film contained about 10% of tungsten silicide (WSi).

The light semi-transmitting film 2a of the phase-shift mask blank of Example 1a had a refractive index of 2.5 as shown in Table 1.

Further, when the film thickness was adjusted to 855 angstroms, the film had a transmittance of 5.4% at a λ=248 nm. The thickness d of the light semi-transmitting film is determined on the basis of the following equation (1).

$$D = (\phi/360) \times \{\lambda/(n-1)\} \qquad (1)$$

in which φ is a phase shift amount, n is a refractive index and λ is the wavelength of exposure light.

In the equation (1), the phase shift amount φ is ideally 180°, while the experiment was carried out on an assumption that the phase shift amount was $160° \leq \phi \leq 200°$.

The light semi-transmitting film 2a of the phase-shift mask blank of Example 1a had a sheet resistance (measured by a four point probe method) of less than $7.6 \times 10^3$ as shown in Table 1.

The light semi-transmitting film 2a of the phase-shift mask blank of Example 1a had a surface roughness (center-line average roughness nmRa defined in JIS B 0601) of 1.8 nmRa as shown in Table 1.

Then, the RF magnetron sputtering was carried out under the same conditions as those in the above preparation of the phase-shift mask blank of Example 1a except that the mixing ratio $Ar/N_2$ of the gas mixture was changed to 25/75, 20/80, 17/83 or 100/0 (vol %/vol %), to give phase-shift mask blanks of Examples 1b, 1c, 1d and 1e.

Table 1 summarizes the element compositional ratio, the refractive index, the film thickness, the transmittance, the sheet resistance and the surface roughness (nmRa) of each of the obtained phase-shift mask blanks of Examples 1b, 1c, 1d and 1e.

For comparison, the RF magnetron sputtering was carried out under the same conditions as those in the above preparation of the phase-shift mask blank of Example 1a except that the introduced gas was replaced with $N_2$ gas, $O_2$ gas or an $Ar$—$O_2$ mixed gas, to give phase-shift mask blanks of Examples 1x, 1y and 1z.

Table 1 summarizes the element mixing ratio, the refractive index, the sheet resistance and the surface roughness (nmRa) of each of the obtained phase-shift mask blanks of Examples 1x, 1y and 1z.

semi-transmitting film is high on one hand, while the transmittance, the sheet resistance and the surface roughness nmRa are small on the other hand. In Examples 1b, 1c and 1d in which the $N_2$ gas content is consecutively increased in the manner in which the gas mixing ratios $Ar/N_2$ of the gas mixture are 25/75, 20/80 and 17/83, the refractive index consecutively decreases from one light semi-transmitting film to another on one hand, and the transmittance, the resistance and the surface roughness nmRa consecutively increase on the other hand. The various physical property values of the light semi-transmitting film can be controlled to desired values in a good balance by controlling the gas mixing ratio $Ar/N_2$ of the gas mixture as described above.

(iii) In Example 1e in which the mixing ratio $Ar/N_2$ of the gas mixture is 100/0 (vol %/vol %), i.e., Ar gas alone is used, there is obtained a phase-shift mask blank having a light semi-transmitting film of which the surface roughness (nmRa) is smaller than those in Examples 1a to 1d and the resistance is very low.

(iv) In Comparative Example 1x in which $N_2$ gas alone is used as a gas introduced into a sputtering apparatus, the light semi-transmitting film of the phase-shift mask blank has a high transmittance, and no performance sufficient as a half-toned phase-shift mask can be obtained. Further, the sheet resistance value is high.

In Comparative Example 1y in which $O_2$ gas alone is used as a gas introduced into a sputtering apparatus, the light semi-transmitting film of the phase-shift mask blank has a high transmittance, and no performance sufficient as a half-toned phase-shift mask can be obtained. Further, the sheet resistance value and the surface roughness are large, and no performance sufficient as a phase-shift mask can be obtained.

TABLE 1

| Example No. | Compositional ratio of target W/Si | Gas mixing ratio $Ar/N_2/O_2$ [vol %] | Element compositional ratio W/Si/N/O [at %] | Refractive index | Film thickness [Å] | Transmittance [%] (*) | Sheet resistance [Ω/□] | Surface roughness (**) |
|---|---|---|---|---|---|---|---|---|
| 1a | 1.1 | 77/23/0 | 40/42/18/0 | 2.5 | 855 | 5.4 | $<7.6*10^3$ | 1.8 |
| 1b | " | 25/75/0 | 29/30/41/0 | 2.5 | 1033 | 7.5 | $<3.8*10^4$ | 2.0 |
| 1c | " | 20/80/0 | 19/21/60/0 | 2.0 | 1183 | 10.1 | $<2.1*10^5$ | 3.5 |
| 1d | " | 17/83/0 | 18/19/63/0 | 1.8 | 1395 | 12.7 | $<2.0*10^6$ | 3.7 |
| 1e | " | 100/0/0 | 47/53/0/0 | 2.5 | 810 | 5.1 | $<1.5*10^{-3}$ | 1.5 |
| CEx. 1x | 1/1 | 0/100/0 | 12/13/75/0 | 1.6 | 1984 | 29.3 | $<5.2*10^8$ | 4.1 |
| CEx. 1y | " | 0/0/100 | 14/16/0/70 | 1.5 | 2570 | 35.5 | $<6.0*10^8$ | 53 |
| CEx. 1z | " | 50/0/50 | 26/29/0/45 | 2.0 | 1240 | 8.0 | $<3.0*10^6$ | 55 |

CEx. = Comparative Example
(*) Transmittance shows a value at a wavelength of 248 nm.
(**) Center-line average roughness [nmRa]

Table 1 shows the following points.

(i) Containing N in combination with W and Si because of the use of $N_2$ gas in combination with Ar gas as a gas introduced into a sputtering device, the light semi-transmitting film of each of the phase-shift mask blanks of Examples 1a to 1d is excellent in the controllability of film thickness and a balance between the two properties of transmittance and resistance. Further, since the surface roughness of each light semi-transmitting films is small, the light semi-transmitting films are excellent in dimensional accuracy in processing.

(ii) By properly changing the gas mixing ratio $Ar/N_2$ of the gas mixture introduced into a sputtering apparatus, the refractive index, the transmittance, the resistance and the surface roughness nmRa can be changed as required. For example, in Example 1a in which the gas mixing ratio $Ar/N_2$ of the gas mixture is 77/23 (vol %/vol %) so that the $N_2$ gas content is relatively small, the refractive index of the light In Comparative Example 1z in which a gas mixture containing Ar gas and $O_2$ gas and having a gas mixing ratio $Ar/O_2$ of 50/50 (vol %/vol %) is used as a gas introduced into a sputtering apparatus, the light semi-transmitting film of the phase-shift mask blank has a high transmittance like that of the phase-shift mask blank of Comparative Example 1y, and no performance sufficient as a half-toned phase-shift mask can be obtained. Further, the sheet resistance is high. And, the surface roughness is large, and no performance sufficient as a phase-shift mask can be obtained.

(Preparation of phase-shift mask)

Phase-shift masks were prepared from the phase-shift mask blanks of the above Examples 1a to 1e. The details thereof will be explained with reference to FIG. 2.

Figure 2A:
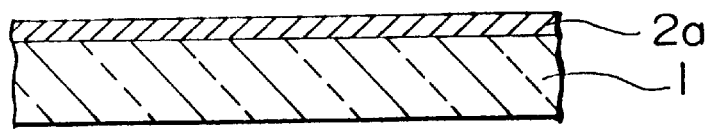
FIG. 2 shows the steps of producing the phase-shift mask of the present invention from the phase-shift mask blank of the present invention.

First, a phase-shift mask blank having a light semi-transmitting film 2a on a transparent substrate 1 was provided (see FIG. 2(a)).

Figure 2B:
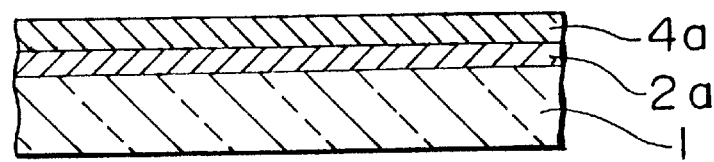
Figure 2C:
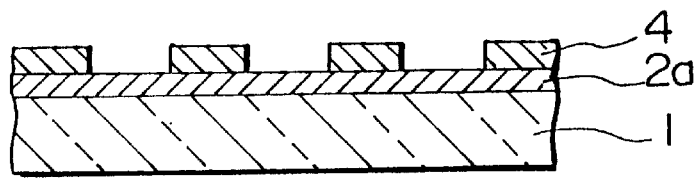

Then, an electron beam resist film 4a (CMS-M8, supplied by Toso Corp.) was formed on the light semi-transmitting film 2a of the above phase-shift mask blank such that the resist film had a thickness of 6,000 angstroms (see FIG. 2(b)). Then, the resist film was exposed to an electron beam in conformity with a predetermined pattern, and then the resist was developed to form a resist pattern 4 (see FIG. 2(c)).

In the light semi-transmitting film 2a of each of the phase-shift mask blanks of Examples 1a to 1e, the etching selection ratio to the transparent substrate 1 (etching rate of light semi-transmitting film/etching rate of transparent substrate) was at least 3, and the light semi-transmitting film 2a could be etched without practically damaging the transparent substrate 1, by carrying out the etching under proper conditions.

Figure 2D:
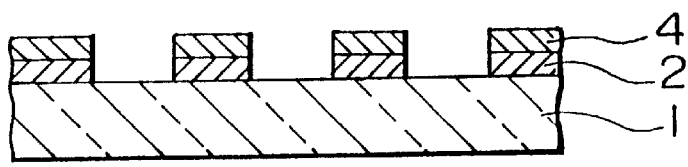

Then, the light semi-transmitting film 2a was dry-etched along the resist pattern 4 with a parallel flat-plate type dry etching apparatus according to a reactive dry-etching method (RIE) (see FIG. 2(d)).

Figure 2E:
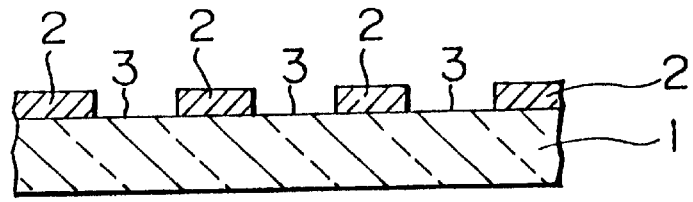

After the dry etching, the remaining resist pattern 4 was peeled off, and the remaining part was cleaned to give a phase-shift mask having a light semi-transmitting portion 2 and a light-transmitting portion 3 (see FIG. 2(e)).

Since the light semi-transmitting film 2a (light semi-transmitting portion 2) of the phase-shift mask blank of each of Examples 1a to 1e had a sufficient adhesion strength to the transparent substrate 1, the phase-shift mask blank resisted ultrasonic cleaning and scrubbing which would be conducted in the cleaning step in the production of a general photo-mask, and further, since the phase-shift mask blank was excellent in acid resistance, it fully resisted washing with hot concentrated sulfuric acid or washing with a mixture of hydrogen peroxide with concentrated acid which would be conducted in the above cleaning step.

Figure 3:
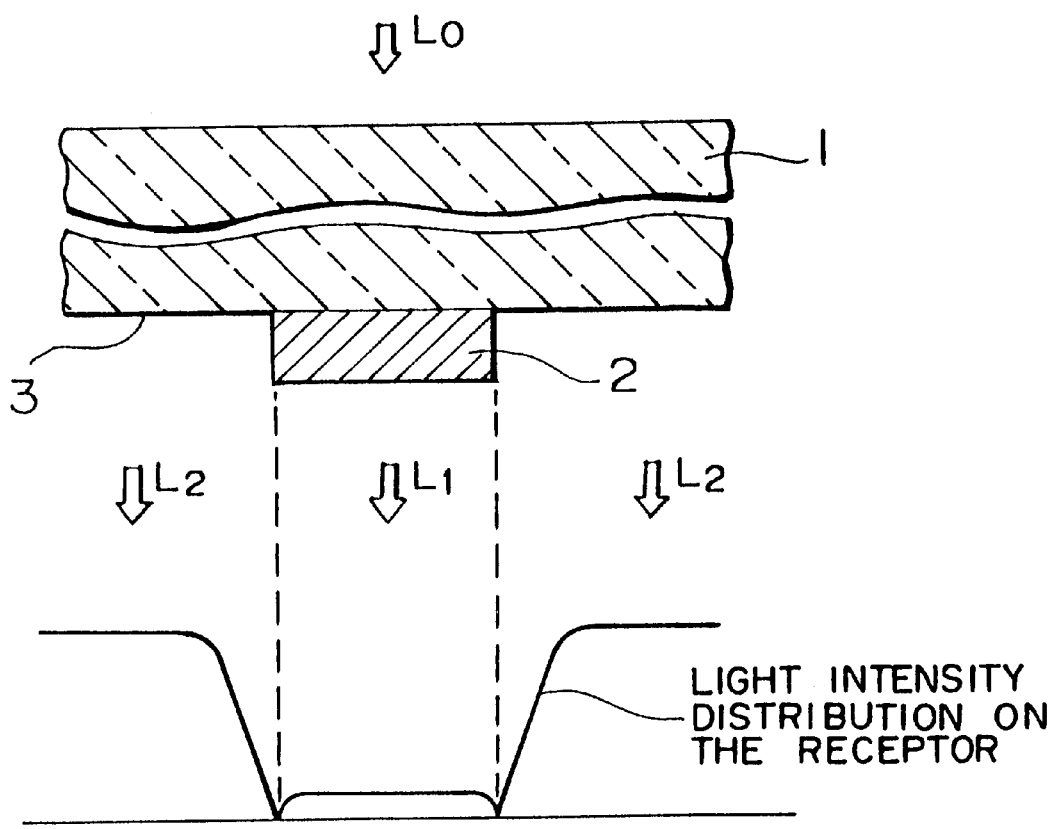
FIG. 3 shows an illustrating view of the function of a half-toned phase-shift mask.

As shown in FIG. 3, when the irradiation with exposure light $L_0$ is carried out through the phase-shift mask, the exposure light $L_0$ is divided into light $L_1$ which passes through the light semi-transmitting portion 2 to reach a receptor not shown and light $L_2$ which passes through the light-transmitting portion 3 to reach the same receptor. In this case, the light $L_1$ which has passed through the light semi-transmitting portion 2 has an intensity to such an extent that it substantially does not contribute to the exposure of the resist. On the other hand, the light $L_2$ which has passed through the light-transmitting portion 3 is intense light which substantially contributes to the exposure, whereby the pattern exposure is therefore possible. In this case, each of light beams which pass the boundary between the light semi-transmitting portion 2 and the light-transmitting portion 3 go around to other's region, while the phases of these two light beams are nearly in a reversed relationship so that the light beams offset each other in the vicinity of the boundary. Therefore, the boundary is made distinct, and the resolution is improved.

The phase-shift masks obtained from the phase-shift mask blanks of Examples 1a to 1e overcame the already described problems ① to ④, i.e., the problems of spatial variability in the phase shift amount, a decrease in the transmittance of the light semi-transmitting film, the occurrence of dust and the hamper of the formation of a finer pattern are overcome, and satisfied the performance excellent over a conventional phase-shift mask.

Further, the obtained phase-shift masks showed a transmittance of about 20% or more in a visible light region, and therefore had an advantage in that it was not necessary to form a film for forming a new alignment mark used for mask positioning (alignment).

When the phase-shift masks obtained from the phase-shift mask blanks of Examples 1a to 1e were used, there was obtained a depth of focus equivalent to that obtained by a conventional phase-shift mask.

EXAMPLE 2

(Preparation of phase-shift mask blank)

Phase-shift mask blanks of Examples 2a, 2b, 2c, 2d and 2e were obtained in the same manner as in Example 1 except that the compositional ratio W/Si of the target was changed to 1/2 while the mixing ratio $Ar/N_2$ of the gas mixture was 77/23, 25/75, 20/80, 17/83 or 100/0 (vol %/vol %).

Table 2 shows the element compositional ratio, the refractive index, the film thickness, the transmittance, the sheet resistance and the surface roughness (nmRa) of each of the obtained phase-shift mask blanks of Examples 2a, 2b, 2c, 2d and 2e.

For comparison, a phase-shift mask blank of Comparative Example 2x was obtained in the same manner as in Example 2 except that the mixture gas was replaced with a mixture gas containing Ar gas and $O_2$ gas and having a mixing ratio $Ar/O_2$ of 50/50 (vol %/vol %). Table 2 shows the element mixing ratio and the properties of the obtained phase-shift mask blank of Comparative Example 2.

TABLE 2

| Example No. | Compositional ratio of target W/Si | Gas mixing ratio $Ar/N_2/O_2$ [vol %] | Element compositional ratio W/Si/N/O [at %] | Refractive index | Film thickness [Å] | Transmittance [%] (*) | Sheet resistance (Ω/□) | Surface roughness (**) |
|---|---|---|---|---|---|---|---|---|
| 2a | 1/2 | 77/23/0 | 26/54/20/0 | 2.6 | 683 | 4.3 | <9.4*10³ | 3.2 |
| 2b | " | 25/75/0 | 14/30/56/0 | 2.5 | 954 | 6.5 | <5.0*10⁴ | 4.3 |
| 2c | " | 20/80/0 | 11/24/65/0 | 2.4 | 984 | 9.1 | <5.2*10⁵ | 5.1 |
| 2d | " | 17/83/0 | 11/21/68/0 | 2.1 | 1238 | 11.3 | <4.8*10⁶ | 6.5 |
| 2e | " | 100/0/0 | 18/72/0/0 | 2.6 | 775 | 5.5 | <1.5*10⁻³ | 1.8 |
| CEx. 2x | 1.2 | 50/0/50 | 13/33/0/41 | 2.2 | 1078 | 7.0 | <4.0*10⁸ | 58 |

CEx. = Comparative Example
(*) Transmittance shows a value at a wavelength of 248 nm.
(**) Center-line average roughness (nmRa)

Table 2 shows the following points.

(i) Containing N in combination with W and Si because of the use of $N_2$ gas in combination with Ar gas as a gas introduced into a sputtering device, the light semi-transmitting film of each of the phase-shift mask blanks of Examples 2a to 2d is excellent in the controllability of film thickness and a balance between the two properties of transmittance and resistance. Further, since the surface roughness of each light semi-transmitting films is small, the light semi-transmitting films are excellent in dimensional accuracy in processing.

(ii) By properly changing the gas mixing ratio $Ar/N_2$ of the gas mixture introduced into a sputtering apparatus, the refractive index, the transmittance, the resistance and the surface roughness nmRa can be changed as required. For example, in Example 2a in which the gas mixing ratio $Ar/N_2$ of the gas mixture is 77/23 (vol %/vol %) so that the $N_2$ gas content is relatively small, the refractive index of the light semi-transmitting film is high on one hand, while the transmittance, the sheet resistance and the surface roughness nmRa are small on the other hand. In Examples 2b, 2c and 2d in which the $N_2$ gas content is consecutively increased in the manner in which the gas mixing ratios $Ar/N_2$ of the gas mixture are 25/75, 20/80 and 17/83, the refractive index consecutively decreases from one light semi-transmitting film to another on one hand, and the transmittance, the resistance and the surface roughness nmRa consecutively increase on the other hand. The various physical property values of the light semi-transmitting film can be controlled to desired values in a good balance by controlling the gas mixing ratio $Ar/N_2$ of the gas mixture as described above.

(iii) In Example 2e in which the mixing ratio $Ar/N_2$ of the gas mixture is 100/0 (vol %/vol %), i.e., Ar gas alone is used, there is obtained a phase-shift mask blank having a light semi-transmitting film of which the surface roughness (nmRa) is smaller than those in Examples 1a to 1d and the resistance is very low. (iv) In Comparative Example 2x in which a gas mixture containing Ar gas and $O_2$ gas and having a gas mixing ratio $Ar/O_2$ of 50/50 (vol %/vol %) is used as a gas introduced into a sputtering apparatus, the light semi-transmitting film of the phase-shift mask blank has a high transmittance, and no performance sufficient as a half-toned phase-shift mask can be obtained. Further, the sheet resistance and the surface roughness is large, and no performance sufficient as a phase-shift mask can be obtained.

(Preparation of phase-shift mask)

Phase-shift masks were obtained from the above-obtained phase-shift mask blanks of Examples 2a to 2e in the same manner as in Example 1.

The obtained five phase-shift masks overcame the above problems ①  to ④  of a conventional phase-shift mask and showed performance excellent over a conventional phase-shift mask.

EXAMPLE 3

Phase-shift mask blanks of Examples 3a to 3f were obtained in the same manner as in Example 1 except that the gas introduced into a sputtering apparatus was replaced with a gas mixture containing Ar gas, $N_2$ gas and $O_2$ gas and that the gas mixing ratio $Ar/N_2/O_2$ was properly changed. Table 3 shows the element compositional ratios and the various property values of the so-obtained phase-shift mask blanks of Examples 3a to 3f.

TABLE 3

| Example No. | Compositional ratio of target W/Si | Gas mixing ratio $Ar/N_2/O_2$ [vol %] | Element compositional ratio W/Si/N/O [at %] | Refractive index | Film thickness [Å] | Transmittance [%] (*) | Sheet resistance [Ω/□] | Surface roughness (**) |
|---|---|---|---|---|---|---|---|---|
| 3a | 1/1 | 8/75/17 | 19/23/33/25 | 1.8 | 1512 | 13.5 | $<2.2*10^7$ | 11.3 |
| 3b | " | 62/19/19 | 32/35/8/25 | 2.4 | 805 | 5.6 | $<6.7*10^6$ | 4.8 |
| 3c | " | 25/50/25 | 19/22/22/37 | 2.1 | 1097 | 7.8 | $<5.2*10^5$ | 8.7 |
| 3d | " | 10/60/30 | 19/21/23/37 | 1.8 | 1615 | 10.5 | $<1.9*10^7$ | 15.2 |
| 3e | " | 33/17/50 | 18/22/13/47 | 2.1 | 1190 | 8.7 | $<2.0*10^5$ | 9.3 |
| 3f | " | 23/23/54 | 18/21/10/51 | 2.0 | 1269 | 9.6 | $<1.2*10^6$ | 10.5 |

(*) Transmittance shows a value at a wavelength of 248 nm.
(**) Center-line average roughness [nmRa]

Table 3 shows the following points.

(i) Containing N in combination with W and Si because of the use of $N_2$ gas in combination with Ar gas as a gas introduced into a sputtering device, the light semi-transmitting film of each of the phase-shift mask blanks of Examples 3a to 3f is excellent in the controllability of film thickness and a balance between the two properties of transmittance and resistance. Further, since the surface roughness of each light semi-transmitting films is small, the light semi-transmitting films are excellent in dimensional accuracy in processing. Moreover, since $O_2$ gas is used in combination, O is included in the film, and the film tends to show an increased transmittance.

(ii) By properly changing the gas mixing ratio $Ar/N_2/O_2$ of the gas mixture, the properties of the light semi-transmitting film, i.e., refractive index, transmittance and resistance can be easily brought into ranges suitable for a phase-shift mask blank by changing the compositional ratio of N and O even without changing the commpositional ratio of W and Si.

However, when the content of O is greater than the predetermined range, the surface roughness of the film increases, which degrades the performance as a phase-shift mask.

(Preparation of phase-shift mask)

Phase-shift masks were obtained from the above-obtained phase-shift mask blanks of Examples 3a to 3f in the same manner as in Example 1.

The obtained six phase-shift masks overcame the above problems ①  to ④  of a conventional phase-shift mask and showed performance excellent over a conventional phase-shift mask.

EXAMPLE 4

(Preparation of phase-shift mask blank)

Phase-shift mask blanks of Examples 4a to 4f were obtained in the same manner as in Example 1 except that the compositional ratio W/Si of the target was changed to 1/2, that the gas mixture was replaced with a gas mixture containing Ar gas, $N_2$ gas and $O_2$ gas and that the gas mixing ratio $Ar/N_2/O_2$ was properly changed. Table 4 shows the element compositional ratios and the various property values of the so-obtained phase-shift mask blanks of Examples 4a to 4f.

TABLE 4

| Example No. | Compositional ratio of target W/Si | Gas mixing ratio Ar/N$_2$/O$_2$ [vol %] | Element compositional ratio W/Si/N/O [at %] | Refractive index | Film thickness [Å] | Transmittance [%] (*) | Sheet resistance [Ω/□] | Surface roughness (**) |
|---|---|---|---|---|---|---|---|---|
| 4a | 1/2 | 8/75/17 | 14/29/30/27 | 2.0 | 1245 | 11.2 | <4.8*10$^7$ | 17.5 |
| 4b | " | 62/19/19 | 21/44/7/28 | 2.6 | 821 | 4.6 | <3.1*10$^5$ | 5.4 |
| 4c | " | 25/50/25 | 13/26/21/40 | 2.3 | 992 | 6.8 | <1.3*10$^6$ | 9.2 |
| 4d | " | 10/60/30 | 12/26/21/41 | 2.0 | 1330 | 9.4 | <4.0*10$^7$ | 20.4 |
| 4e | " | 33/17/50 | 13/27/11/49 | 2.4 | 907 | 7.3 | <6.9*10$^5$ | 10.7 |
| 4f | " | 23/23/54 | 12/24/9/55 | 2.2 | 1013 | 8.8 | <3.8*10$^6$ | 12.6 |

(*) Transmittance shows a value at a wavelength of 248 nm.
(**) Center-line average roughness [nmRa]

Table 4 shows the following points.

(i) Containing N in combination with W and Si because of the use of N$_2$ gas in combination with Ar gas as a gas introduced into a sputtering device, the light semi-transmitting film of each of the phase-shift mask blanks of Examples 3a to 3f is excellent in the controllability of film thickness and a balance between the two properties of transmittance and resistance. Further, since the surface roughness of each light semi-transmitting films is small, the light semi-transmitting films are excellent in dimensional accuracy in processing. Moreover, since O$_2$ gas is used in combination, O is included in the film, and the film tends to show an increased transmittance.

(ii) By properly changing the gas mixing ratio Ar/N$_2$/O$_2$ of the gas mixture, the properties of the light semi-transmitting film, i.e., refractive index, transmittance and resistance can be easily brought into ranges suitable for a phase-shift mask blank by changing the compositional ratio of N and O even without changing the compositional ratio of W and Si.

However, when the content of O is greater than the predetermined range, the surface roughness of the film increases, which degrades the performance as a phase-shift mask.

(Preparation of phase-shift mask)

Phase-shift masks were obtained from the above-obtained phase-shift mask blanks of Examples 4a to 4f in the same manner as in Example 1.

The obtained six phase-shift masks overcame the above problems ① to ④ of a conventional phase-shift mask and showed performance excellent over a conventional phase-shift mask.

EXAMPLE 5

(Preparation of phase-shift mask blank)

Phase-shift mask blanks of Examples 5a, 5b and 5c were obtained in the same manner as in Example 1 except that the target was replaced with a target which was formed of Ta and Si and had a Ta/Si ratio of 1/1 and that the mixing ratio Ar/N$_2$/O$_2$ Of the introduced gas was changed to 25/75/0, 25/50/25 or 100/0/0 (vol %/vol %). Table 5 shows the element compositional ratios and the various property values of the light semi-transmitting films of the so-obtained phase-shift mask blanks of Examples 5a to 5c.

For comparison, phase-shift mask blanks of Comparative Examples 5x to 5z were obtained in the same manner as in Example 5 except that the mixture gas was replaced with N$_2$ gas, O$_2$ gas or an Ar/O$_2$=50/50 (vol %/vol %) mixture gas. Table 5 also shows the element compositional ratios and the various property values of the light semi-transmitting films of these comparative phase-shift mask blanks.

TABLE 5

| Example No. | Compositional ratio of target Ta/Si | Gas mixing ratio Ar/N$_2$/O$_2$ [vol %] | Element compositional ratio Ta/Si/N/O [at %] | Refractive index | Film thickness [Å] | Transmittance [%] (*) | Sheet resistance [Ω/□] | Surface roughness (**) |
|---|---|---|---|---|---|---|---|---|
| 5a | 1/1 | 25/75/0 | 27/31/42/0 | 2.25 | 1019 | 6.8 | <3.8*10$^4$ | 2.2 |
| 5b | " | 25/50/25 | 17/23/25/35 | 2.18 | 978 | 7.2 | <4.8*10$^5$ | 7.9 |
| 5c | " | 100/0/0 | 49/51/0/0 | 2.7 | 800 | 5.1 | <1.6*10$^{-3}$ | 1.5 |
| CEx. 5x | 1/1 | 0/100/0 | 12/15/73/0 | 1.5 | 2380 | 31.0 | <6.7*10$^8$ | 5.3 |
| CEx. 5y | " | 0/0/100 | 12/14/0/74 | 1.5 | 2605 | 36.2 | <7.2*10$^8$ | 61 |
| CEx. 5z | " | 50/0/50 | 25/30/0/45 | 2.1 | 1127 | 9.5 | <2.5*10$^6$ | 55 |

(*) Transmittance shows a value at a wavelength of 248 nm.
(**) Center-line average roughness [nmRa]

Table 5 shows the following points.

(i) In Example 5 in which a tantalum•silicon target is used, the effects produced on the properties of the light semi-transmitting film by allowing the sputtering gas to contain N$_2$ gas and O$_2$ gas and by changing the gas mixing ratio Ar/N$_2$/O$_2$ are similar to those in the above Examples 1 to 4 in which the tungsten•silicon target is used.

(Preparation of phase-shift mask)

Phase-shift masks were obtained from the above-obtained phase-shift mask blanks of Examples 5a, 5b and 5c in the same manner as in Example 1.

The obtained three phase-shift masks overcame the above problems ① to ④ of a conventional phase-shift mask and showed performance excellent over a conventional phase-shift mask.

EXAMPLE 6

(Preparation of phase-shift mask blank)

Phase-shift mask blanks 6a, 6b and 6c were obtained in the same manner as in Example 5 except that the target composition Ta/Si was changed to 1/2. Table 6 shows the element compositional ratios and the various property values of the light semi-transmitting films of the so-obtained phase-shift mask blanks of Examples 6a to 6c.

For comparison, a phase-shift mask blank of Comparative Example 6x was obtained in the same manner as in Example 6 except that the mixture gas was replaced with an $Ar/O_2=$ 50/50 (vol %/vol %) mixture gas. Table 6 also shows the element compositional ratio and the various property values of the light semi-transmitting film of the obtained phase-shift mask blank of Comparative Example 6x.

(Preparation of phase-shift mask)

A phase-shift mask was obtained from the above-obtained phase-shift mask blank of Example 7a in the same manner as in Example 1.

The obtained phase-shift mask overcame the above problems ① to ④ of a conventional phase-shift mask and showed performance excellent over a conventional phase-shift mask.

TABLE 6

| Example No. | Compositional ratio of target Ta/Si | Gas mixing ratio $Ar/N_2/O_2$ [vol %] | Element compositional ratio Ta/Si/N/O [at %] | Refractive index | Film thickness [Å] | Transmittance [%] (*) | Sheet resistance [Ω/□] | Surface roughness (**) |
|---|---|---|---|---|---|---|---|---|
| 6a | 1/2 | 25/75/0 | 13/30/57/0 | 2.05 | 1240 | 6.0 | <5.0*10⁴ | 5.1 |
| 6b | " | 25/50/25 | 13/27/21/39 | 2.21 | 1117 | 6.5 | <9.3*10⁵ | 8.5 |
| 6c | " | 100/0/0 | 33/67/0/0 | 2.6 | 765 | 5.7 | <2.3*10⁻³ | 1.7 |
| CEx. 6x | 1/2 | 50/0/50 | 12/35/0/53 | 2.1 | 1097 | 7.7 | <3.2*10⁶ | 60 |

(*) Transmittance shows a value at a wavelength of 248 nm.
(**) Center-line average roughness [nmRa]

Table 6 shows the following points.

(i) In Example 6 in which a tantalum·silicon target is used, the effects produced on the properties of the light semi-transmitting film by allowing the sputtering gas to contain $N_2$ gas and $O_2$ gas and by changing the gas mixing ratio $Ar/N_2/O_2$ are similar to those in the above Examples 1 to 4 in which the tungsten·silicon target is used.

(Preparation of phase-shift mask)

Phase-shift masks were obtained from the above-obtained phase-shift mask blanks of Examples 6a, 6b and 6c in the same manner as in Example 1.

EXAMPLE 7

(Preparation of phase-shift mask blank)

A phase-shift mask blank of Example 7a was obtained in the same manner as in Example 1 except that the target was replaced with a target formed of Cr and Si. Table 7 shows the element compositional ratio and the various property values of the light semi-transmitting film of the so-obtained phase-shift mask blank of Example 7a.

Table 7 also shows the elemental compositional ratios and the various property values of the light semi-transmitting films of phase-shift mask blanks of Comparative Examples 7x and 7y obtained by using a target formed of Cr and Si but by introducing $O_2$ gas or $N_2$ gas alone into a sputtering apparatus.

EXAMPLE 8

(Preparation of phase-shift mask blank)

A phase-shift mask blank of Example 8a was obtained in the same manner as in Example 1 except that the target was replaced with a target formed of Ti and Si. Table 8 shows the element compositional ratio and the various property values of the light semi-transmitting film of the so-obtained phase-shift mask blank of Example 8a.

Table 7 also shows the elemental compositional ratios and the various property values of the light semi-transmitting films of phase-shift mask blanks of Comparative Examples 8x and 8y obtained by using a target formed of Ti and Si but by introducing $O_2$ gas or $N_2$ gas alone into a sputtering apparatus.

TABLE 7

| Example No. | Compositional ratio of target Cr/Si | Gas mixing ratio $Ar/N_2/O_2$ [vol %] | Element compositional ratio Cr/Si/N/O [at %] | Refractive index | Film thickness [Å] | Transmittance [%](*) | Sheet resistance [Ω/□] | Surface roughness (**) |
|---|---|---|---|---|---|---|---|---|
| 7a | 1/2 | 25/50/25 | 14/29/20/37 | 2.3 | 1007 | 6.7 | <1.1*10⁶ | 8.3 |
| CEx. 7x | 1/1 | 0/0/100 | 13/16/0/71 | 1.6 | 2263 | 28.1 | <8.6*10⁸ | 68 |
| CEx. 7y | " | 0/100/0 | 11/13/76/0 | 1.7 | 1877 | 25.4 | <5.3*10⁸ | 6.4 |

(*)Transmittance shows a value at a wavelength of 248 nm.
(**)Center-line average roughness [nmRa]

TABLE 8

| Example No. | Compositional ratio of target Ti/Si | Gas mixing ratio Ar/$N_2$/$O_2$ [vol %] | Element compositional ratio Ti/Si/N/O [at %] | Refractive index | Film thickness [Å] | Transmittance [%] (*) | Sheet resistance [Ω/□] | Surface roughness (**) |
|---|---|---|---|---|---|---|---|---|
| 8a | 1/2 | 25/50/25 | 15/31/19/35 | 2.5 | 1074 | 6.6 | <1.4*$10^6$ | 7.5 |
| CEx. 8x | 1/1 | 0/0/100 | 14/15/0/71 | 1.5 | 2418 | 34.5 | <6.8*$10^8$ | 56 |
| CEx. 8y | " | 0/100/0 | 13/14/73/0 | 1.6 | 2199 | 28.8 | <5.9*$10^8$ | 5.0 |

(*) Transmittance shows a value at a wavelength of 248 nm.
(**) Center-line average roughness [nmRa]

(Preparation of phase-shift mask)

A phase-shift mask was obtained from the above-obtained phase-shift mask blank of Example 8a in the same manner as in Example 1.

The phase-shift masks obtained in Examples 1 to 8 are used in a lithography process, etc. In the lithography process, a pattern on a phase-shift mask is transferred to a receptor such as a resist, etc., which is applied to a substrate and pre-baked, with an exposure apparatus. The transfer of the mask pattern to the receptor by exposure is carried out, for example, as shown in FIG. 3. The schematic intensity distribution of exposure light on the receptor is as shown in FIG. 3, and the pattern transfer with a high resolution can be carried out. The wavelength for the exposure naturally includes 468 nm (g ray), 365 nm (i ray) and 248 nm (KrF excimer laser), and 193 nm (ArF excimer laser) can be also used. Since the above pattern transfer method uses the phase-shift mask having the light semi-transmitting film of which the surface roughness is in the predetermined range and the resistance is low, the pattern transfer with high dimensional accuracy in processing can be permitted. For example, the above pattern transfer method can be applied to a process for forming a hole pattern having a diameter of 0.3 μm on a substrate. Further, the problem caused by the electrostatic adsorption of dust on the mask can be reduced.

We claim:

1. A phase-shift mask blank having a light semi-transmitting film which contains a transition metal, silicon and nitrogen as the main components on a transparent substrate,
    the light semi-transmitting film containing 5 to 70 at % of nitrogen and the light semi-transmitting film having a surface center-line average roughness of 0.1 to 10 nm Ra.

2. The phase-shift mask blank of claim 1, wherein the light semi-transmitting film contains 5 to 55 at % of the transition metal.

3. The phase-shift mask blank of claim 1, wherein the light semi-transmitting film contains 5 to 80 at % of silicon.

4. The phase-shift mask blank of claim 1, wherein the light semi-transmitting film has a transmittance of 4 to 20% to exposure light.

5. The phase-shift mask blank of claim 1, wherein the light semi-transmitting film has a sheet resistance of 50 to 5×$10^7$ Ω/□.

6. The phase-shift mask blank of claim 1, wherein the transition metal is at least one selected from tungsten, tantalum, chromium or titanium.

7. A phase-shift mask having a mask pattern formed of a light-transmitting portion and a light semi-transmitting portion, obtained by a patterning treatment in which the light semi-transmitting film of the phase-shift mask blank recited in claim 1 is selectively removed in conformity with a predetermined pattern.

8. A method of transferring a pattern formed on a mask to a receptor by exposure, wherein the mask is the phase-shift mask recited in claim 7.

9. A phase-shift mask blank of claim 1 wherein not more than ½ of the total of silicon atoms which are contained in the light semi-transmitting film are forming silicide by directly bonding to the transition metal.

10. A phase-shift mask having a mask pattern formed of a light-transmitting portion and a light semi-transmitting portion, obtained by a patterning treatment in which the light semi-transmitting film of the phase-shift mask blank recited in claim 9 is selectively removed in conformity with a predetermined pattern.

11. A process for the production of a phase-shift mask blank having a light semi-transmitting film which contains a transition metal, silicon and nitrogen as the main components on a transparent substrate,
    the light semi-transmitting film containing 5 to 70 at % of nitrogen and the light semi-transmitting film having a surface center-line average roughness of 0.1 to 10 nm Ra which process comprises the step of sputtering with a transition metal and silicon being as a target while introducing a gas containing a nitrogen gas and/or a nitrogen compound gas, in the substantial absence of an oxygen gas and/or an oxygen compound gas into a sputtering apparatus, to form a light semi-transmitting film which at least contains a transition metal, silicon and nitrogen.

* * * * *